US012394724B2

(12) United States Patent
Liao et al.

(10) Patent No.: US 12,394,724 B2
(45) Date of Patent: Aug. 19, 2025

(54) CHIP PACKAGE STRUCTURE AND ELECTROMAGNETIC INTERFERENCE SHIELDING PACKAGE MODULE THEREOF

(71) Applicant: AZUREWAVE TECHNOLOGIES, INC., New Taipei (TW)

(72) Inventors: Chih-Hao Liao, Taipei (TW); Hsin-Yeh Huang, Taipei (TW); Shu-Han Wu, Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 465 days.

(21) Appl. No.: 17/964,868

(22) Filed: Oct. 12, 2022

(65) Prior Publication Data
US 2024/0047373 A1    Feb. 8, 2024

(30) Foreign Application Priority Data

Aug. 8, 2022 (TW) .................................. 111129671

(51) Int. Cl.
*H01L 23/552* (2006.01)
*H01L 23/544* (2006.01)
*H01L 25/16* (2023.01)

(52) U.S. Cl.
CPC .......... *H01L 23/552* (2013.01); *H01L 23/544* (2013.01); *H01L 25/165* (2013.01); *H01L 2223/54413* (2013.01); *H01L 2223/54433* (2013.01)

(58) Field of Classification Search
CPC . H01L 2223/54413; H01L 2223/54433; H01L 23/544; H01L 2924/3025; H01L 23/552; H01L 2223/54486; H01L 25/165; H01L 2924/1815

USPC ......................................................... 257/659
See application file for complete search history.

(56) References Cited

U.S. PATENT DOCUMENTS

| 2009/0236739 A1* | 9/2009 | Chen ..................... H01L 23/544 |
| | | 257/737 |
| 2010/0171214 A1* | 7/2010 | Yamaji ................. B23K 26/364 |
| | | 257/E23.179 |
| 2021/0183719 A1* | 6/2021 | Nishidono .......... H01L 23/3121 |
| 2021/0358859 A1* | 11/2021 | Chen ....................... H01L 25/16 |
| 2021/0399413 A1* | 12/2021 | Liao ......................... H01Q 1/02 |

* cited by examiner

*Primary Examiner* — Didarul A Mazumder
(74) *Attorney, Agent, or Firm* — Li & Cai Intellectual Property Office

(57) ABSTRACT

A chip package structure and an electromagnetic interference (EMI) shielding package module thereof are provided. The EMI shielding package module includes an encapsulant, an EMI shielding layer, and a recognition contrast layer. The encapsulant has a patterned trench that is recessed in a top surface thereof. The EMI shielding layer includes a recognition region formed on the top surface and an embedded region that is filled in the patterned trench. The recognition contrast layer is filled in the patterned trench and is connected to the embedded region. The recognition contrast layer and the recognition region respectively have different colors that conform to grade A or grade B in ISO/IEC 15415 standard. An end portion of the recognition contrast layer protruding from the top surface is coplanar with the recognition region so as to jointly form a predetermined two-dimensional (2D) code pattern having a planar shape.

10 Claims, 9 Drawing Sheets

CHIP PACKAGE STRUCTURE AND ELECTROMAGNETIC INTERFERENCE SHIELDING PACKAGE MODULE THEREOF

CROSS-REFERENCE TO RELATED PATENT APPLICATION

This application claims the benefit of priority to Taiwan Patent Application No. 111129671, filed on Aug. 8, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a chip package structure and an electromagnetic interference (EMI) shielding package module thereof.

BACKGROUND OF THE DISCLOSURE

A conventional chip package structure has a recognition code printed on a top side of an encapsulant thereof, however, the recognition code is not coplanar with the top side of the encapsulant, such that the recognition code can be easily damaged and become unrecognizable.

SUMMARY OF THE DISCLOSURE

In response to the above-referenced technical inadequacy, the present disclosure provides a chip package structure and an electromagnetic interference (EMI) shielding package module thereof to effectively improve on the issues associated with conventional chip package structures.

In one aspect, the present disclosure provides a chip package structure, which includes a substrate, a chip module, an encapsulant, an electromagnetic interference (EMI) shielding layer, and a recognition contrast layer. The substrate has a first board surface and a second board surface that is opposite to the first board surface. The substrate has a plurality of conductive portions arranged on the second board surface. The chip module is mounted on the first board surface and is electrically coupled to the conductive portions. The encapsulant is formed on the first board surface. The chip module is embedded in the encapsulant. The encapsulant has a patterned trench that is recessed in a top surface thereof and that corresponds in shape to a predetermined two-dimensional (2D) code pattern. The EMI shielding layer covers the encapsulant. The EMI shielding layer includes a recognition region formed on the top surface and an embedded region that is formed in the patterned trench. The recognition contrast layer is filled in the patterned trench and is connected to the embedded region. The recognition contrast layer and the recognition region of the EMI shielding layer respectively have different colors that conform to grade A or grade B in the ISO/IEC 15415 standard. An end portion of the recognition contrast layer protrudes from the top surface of the encapsulant and is coplanar with the recognition region of the EMI shielding layer, so that the recognition contrast layer and the recognition region of the EMI shielding layer jointly form the predetermined 2D code pattern having a planar shape.

In another aspect, the present disclosure provides an electromagnetic interference (EMI) shielding package module of a chip package structure, which includes an encapsulant, an EMI shielding layer, and a recognition contrast layer. The encapsulant has a patterned trench that is recessed in a top surface thereof and that corresponds in shape to a predetermined two-dimensional (2D) code pattern. The EMI shielding layer covers the encapsulant. The EMI shielding layer includes a recognition region formed on the top surface and an embedded region that is formed in the patterned trench. The recognition contrast layer is filled in the patterned trench and is connected to the embedded region. The recognition contrast layer and the recognition region of the EMI shielding layer respectively have different colors that conform to grade A or grade B in the ISO/IEC 15415 standard. An end portion of the recognition contrast layer protrudes from the top surface of the encapsulant and is coplanar with the recognition region of the EMI shielding layer, so that the recognition contrast layer and the recognition region of the EMI shielding layer jointly form the predetermined 2D code pattern having a planar shape.

Therefore, any one of the chip package structure and the EMI shielding package module of the present disclosure is provided with the predetermined 2D code pattern that is formed by a structural cooperation of the encapsulant, the EMI shielding layer, and the recognition contrast layer, so that the predetermined 2D code pattern not only provides for high recognition accuracy, but also has a planar shape that is not easily damaged.

Specifically, in the chip package structure provided by the present disclosure, the EMI shielding layer covers the encapsulant, thereby effectively increasing the EMI shielding effect of the at least one chip and preventing the at least one chip embedded in the encapsulant from being exposed to the external environment.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
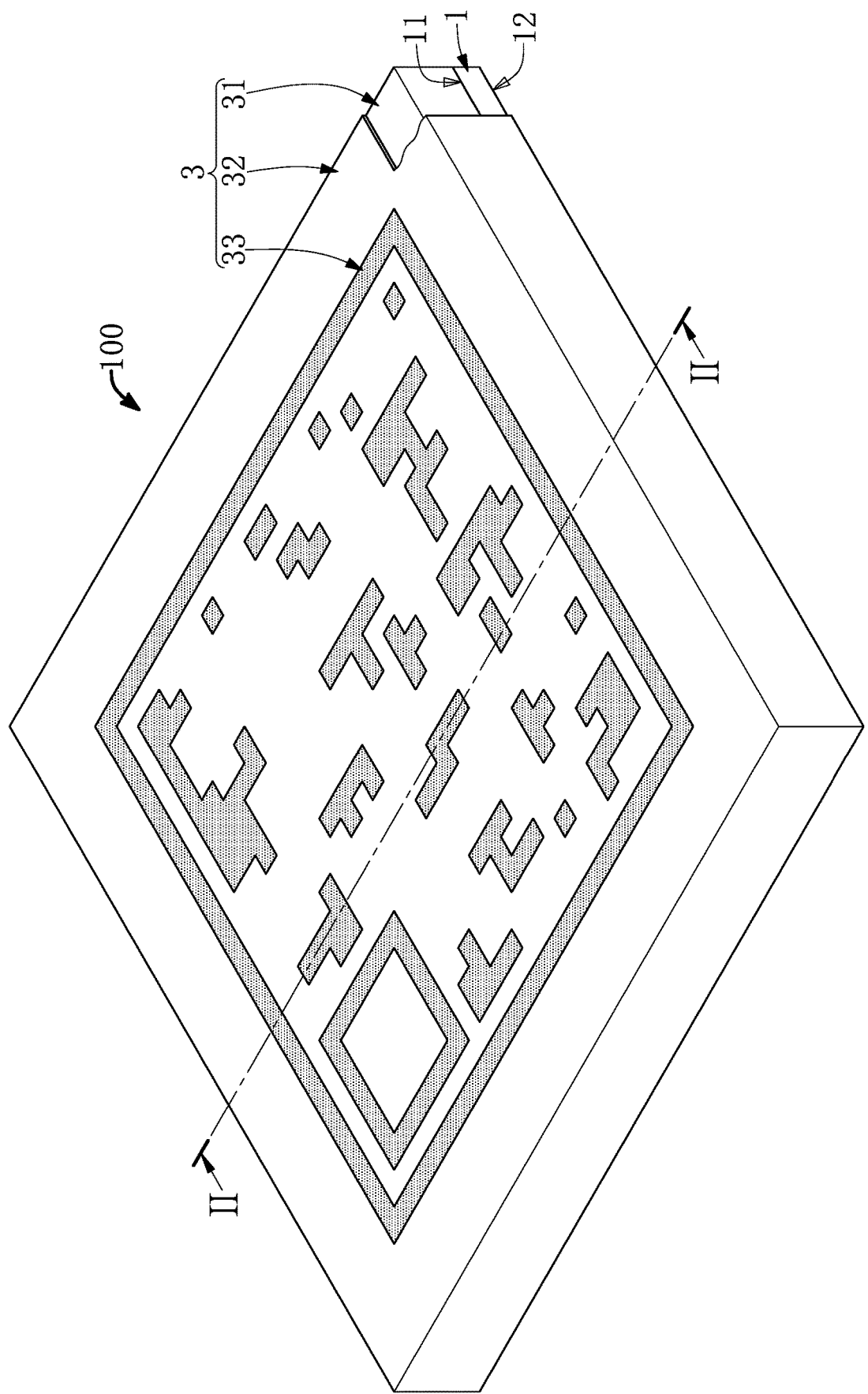
FIG. 1 is a perspective view of a chip package structure according to a first embodiment of the present disclosure.
Figure 2:
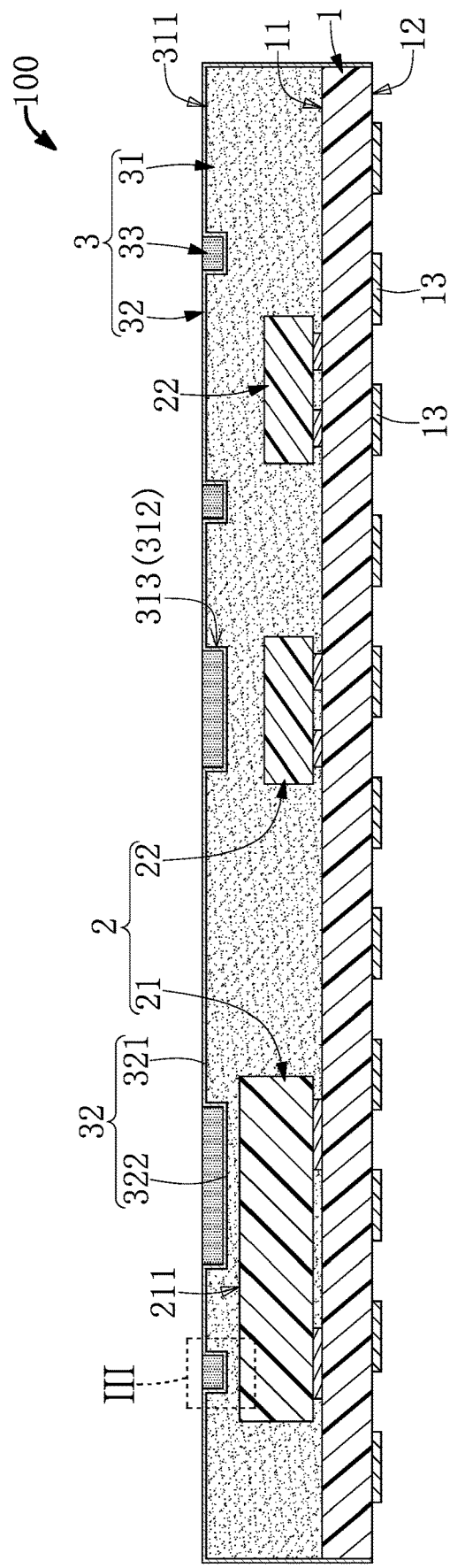
FIG. 2 is a cross-sectional view taken along line II-II of FIG. 1.
Figure 3:
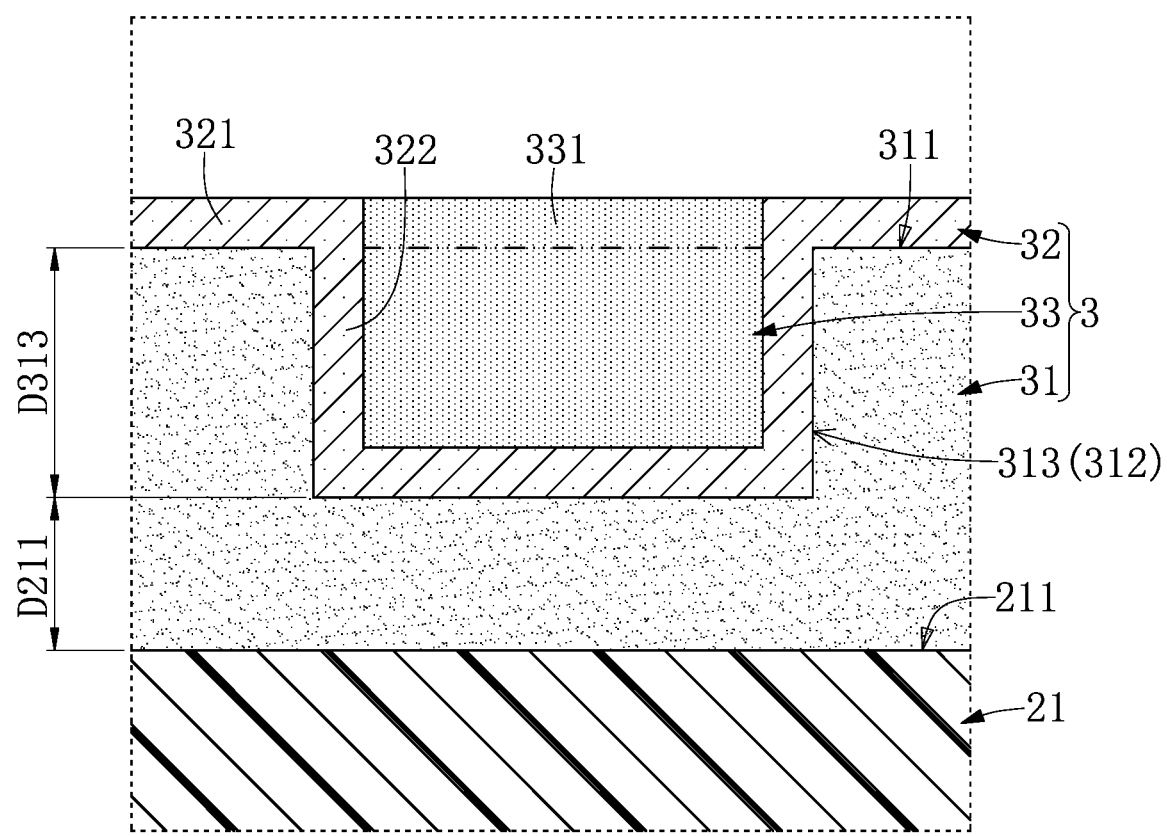
FIG. 3 is an enlarged view of part III of FIG. 2.
Figure 4:
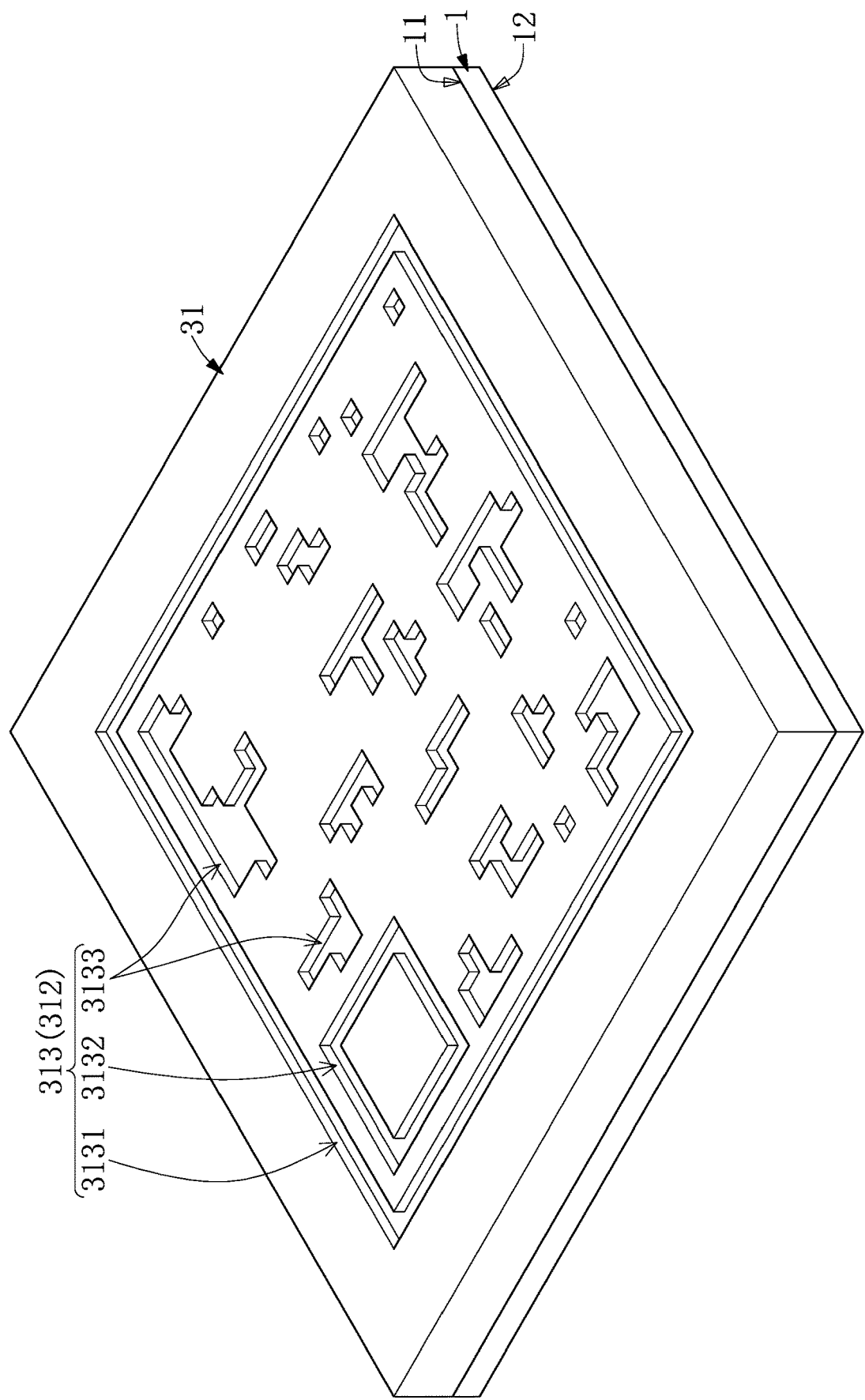
FIG. 4 is a perspective view showing an encapsulant of FIG. 1.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure provides a chip package structure 100 preferably being a system in package (SiP), but the present disclosure is not limited thereto. The chip package structure 100 includes a substrate 1 having a flat shape, a chip module 2 mounted on the substrate 1, and an electromagnetic interference (EMI) shielding package module 3 that is formed on the substrate 1.

It should be noted that the EMI shielding package module 3 in the present embodiment is described in cooperation with the substrate 1 and the chip module 2, but the present disclosure is not limited thereto. For example, in other embodiments of the present disclosure not shown in the drawings, the EMI shielding package module 3 can be used in cooperation with other components.

In the present embodiment, the substrate 1 has a first board surface 11 and a second board surface 12 that is opposite to the first board surface 11, and the substrate 1 has a plurality of conductive portions 13 arranged on the second board surface 12. The conductive portions 13 are metal pads that can be used in a surface mount technology (SMT) manner, but in other embodiments of the present disclosure not shown in the drawings, the conductive portions 13 can be other structures (e.g., insertion pins).

The chip module 2 is electrically coupled to the conductive portions 13 of the substrate 1. The chip module 2 includes at least one chip 21 and a plurality of passive components 22, and the at least one chip 21 and the passive components 22 are mounted on the first board surface 11. The connection manner between the at least one chip 21 (or the passive components 22) and the substrate 1 can be a flip chip manner or a wire bonding manner, but the present disclosure is not limited thereto.

Moreover, the type of the at least one chip 21 can be adjusted or changed according to design requirements. For example, the chip 21 can be a radio frequency identification (RFID) chip, a mobile payment chip, a machine-to-machine (M2M) chip, a wireless sensor chip, a communication chip or other type.

The EMI shielding package module 3 includes an encapsulant 31, an EMI shielding layer 32 covering the encapsulant 31, and a recognition contrast layer 33 that is formed on a part of the EMI shielding layer 32. It should be noted that any package module provided without an EMI shielding layer is different from the EMI shielding package module 3 of the present embodiment.

In the present embodiment, the encapsulant 31 is a molding compound for being accurately formed in a predetermined shape, but the present disclosure is not limited thereto. The encapsulant 31 is formed on the first board surface 11 of the substrate 1, and the chip module 2 is embedded in the encapsulant 31. In addition, in other embodiments of the present disclosure not shown in the drawings, the encapsulant 31 can further extend to cover a surrounding lateral side of the substrate 1 and the second board surface 12, but the conductive portions 13 need to be exposed from the encapsulant 31.

Furthermore, the encapsulant 31 has a patterned trench 312 that is recessed in a top surface 311 thereof and that corresponds in shape to a predetermined two-dimensional (2D) code pattern. The predetermined 2D code pattern in the present embodiment is a QR code, but the predetermined 2D code pattern can be adjusted or changed according to design requirements. For example, the predetermined 2D code pattern can be a data matrix, an aztec code, a PDF417, a micro PDF, a GS1 databar, or a pharmacode.

Specifically, the patterned trench 312 in the present embodiment has a plurality of slots 313 that are separate from each other, and each of the slots 313 is preferably a laser engraving slot and has a depth D313 within a range from 15 µm to 30 µm. The depths D313 of the slots 313 in the present embodiment are the same, but the present disclosure is not limited thereto. For example, in other embodiments of the present disclosure not shown in the drawings, the slots 313 can have the depths D313 that are slightly different from one another according to design requirements.

In the present embodiment, the slots 313 include an outer square slot 3131, at least one inner square slot 3132, and a plurality of irregular slots 3133. An area surrounded by the outer square slot 3131 substantially occupies at least 70% of an area of the top surface 311 of the encapsulant 31, and four corners of the outer square slot 3131 are respectively spaced apart from four corners of the top surface 311 by a same interval. The at least one inner square slot 3132 and the irregular slots 3133 are arranged at an inner side of the outer square slot 3131, and the at least one inner square slot 3132 corresponds in position to at least one of the four corners of the outer square slot 3131.

In addition, a top side 211 of the at least one chip 21 is embedded in the encapsulant 31 and is spaced apart from at least one of the slots 313 adjacent thereto by a distance D211 within a range from 1 µm to 10 µm, but the present disclosure is not limited thereto. In other words, the depth (or the distance D211) of the top side 211 of the at least one chip 21 with respect to the encapsulant 31 is reduced due to an adjacent one of the slots 313, such that a probability of the at least one chip 21 being affected by EMI may be increased.

Accordingly, in the chip package structure 100 provided by the present embodiment, the EMI shielding layer 32 covers an entirety of an outer surface of the encapsulant 31 (e.g., inner walls of the slots 313 are completely covered by the EMI shielding layer 32), thereby effectively preventing the at least one chip 21 from being affected by EMI. The EMI shielding layer 32 includes a recognition region 321 formed on the top surface 311 and an embedded region 322 that is formed in the patterned trench 312. The embedded region 322 has a plurality of portions that are respectively located in the slots 313 and that are integrally connected to the recognition region 321 so as to be jointly formed as a single one-piece structure.

Specifically, the EMI shielding layer 32 in the present embodiment is a nano-metallic layer (e.g., a nano-silver layer) and has a thickness that can be within a range from 3 µm to 5 µm. The EMI shielding layer 32 is preferably formed in an ultrasonic spraying manner for covering all corners of each of the slots 313. In other words, the EMI shielding layer 32 provided by the present embodiment is not formed in an electroplating manner, but the present disclosure is not limited thereto.

The recognition contrast layer 33 and the recognition region 321 of the EMI shielding layer 32 respectively have different colors that conform to grade A or grade B in the ISO/IEC 15415 standard. In the present embodiment, each of the recognition contrast layer 33 and the EMI shielding layer 32 is of a single color (e.g., the recognition contrast layer 33 is a black toner layer, and the color of the EMI shielding layer 32 is silver), but the present disclosure is not limited thereto. For example, in other embodiments of the present disclosure not shown in the drawings, the recognition contrast layer 33 can be made of a material other than toner.

Specifically, the recognition contrast layer 33 is filled in the patterned trench 312 and is connected to the embedded region 322, and an end portion 331 (e.g., a top portion) of the recognition contrast layer 33 protrudes from the top surface 311 of the encapsulant 31 and is coplanar with the recognition region 321 of the EMI shielding layer 32, so that the recognition contrast layer 33 and the recognition region 321 of the EMI shielding layer 32 jointly form the predetermined 2D code pattern having a planar shape.

Accordingly, the chip package structure 100 of the present embodiment is provided with the predetermined 2D code pattern that is formed by a structural cooperation of the encapsulant 31, the EMI shielding layer 32, and the recognition contrast layer 33, so that the predetermined 2D code pattern not only provides for high recognition accuracy, but also has a planar shape that is not easily damaged.

Furthermore, any 2D code not having a planar shape or not conforming to grade A or grade B in the ISO/IEC 15415 standard is different from the predetermined 2D code pattern of the present embodiment that is formed in a planar shape through the recognition contrast layer 33 and the recognition region 321 of the EMI shielding layer 32.

Second Embodiment

Figure 5:
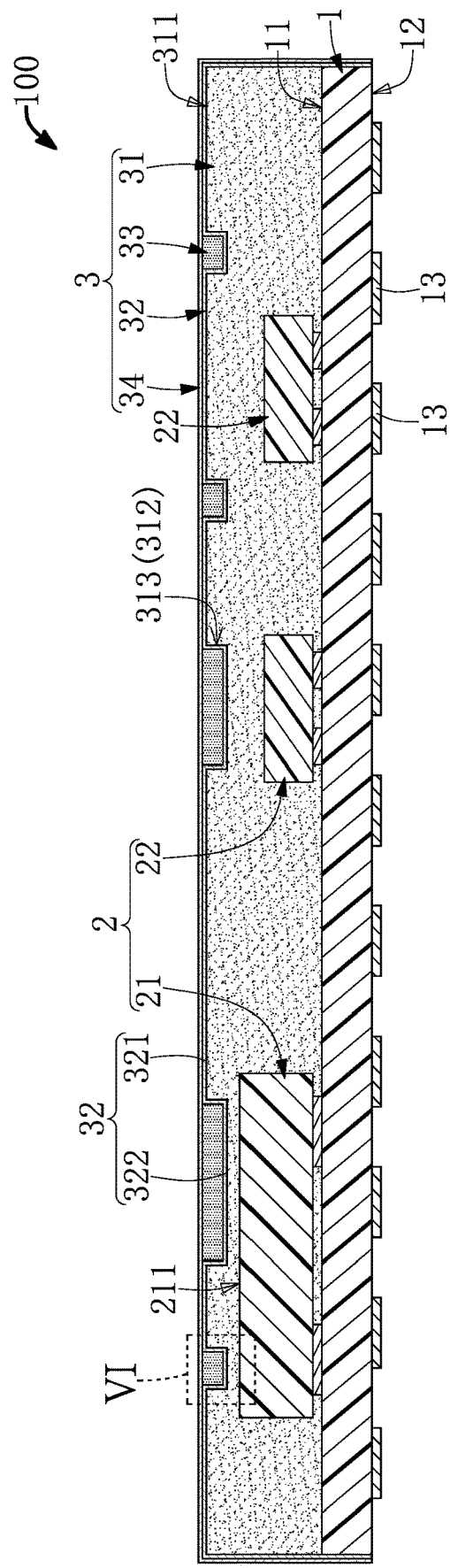
FIG. 5 is a cross-sectional view of the chip package structure according to a second embodiment of the present disclosure.
Figure 6:
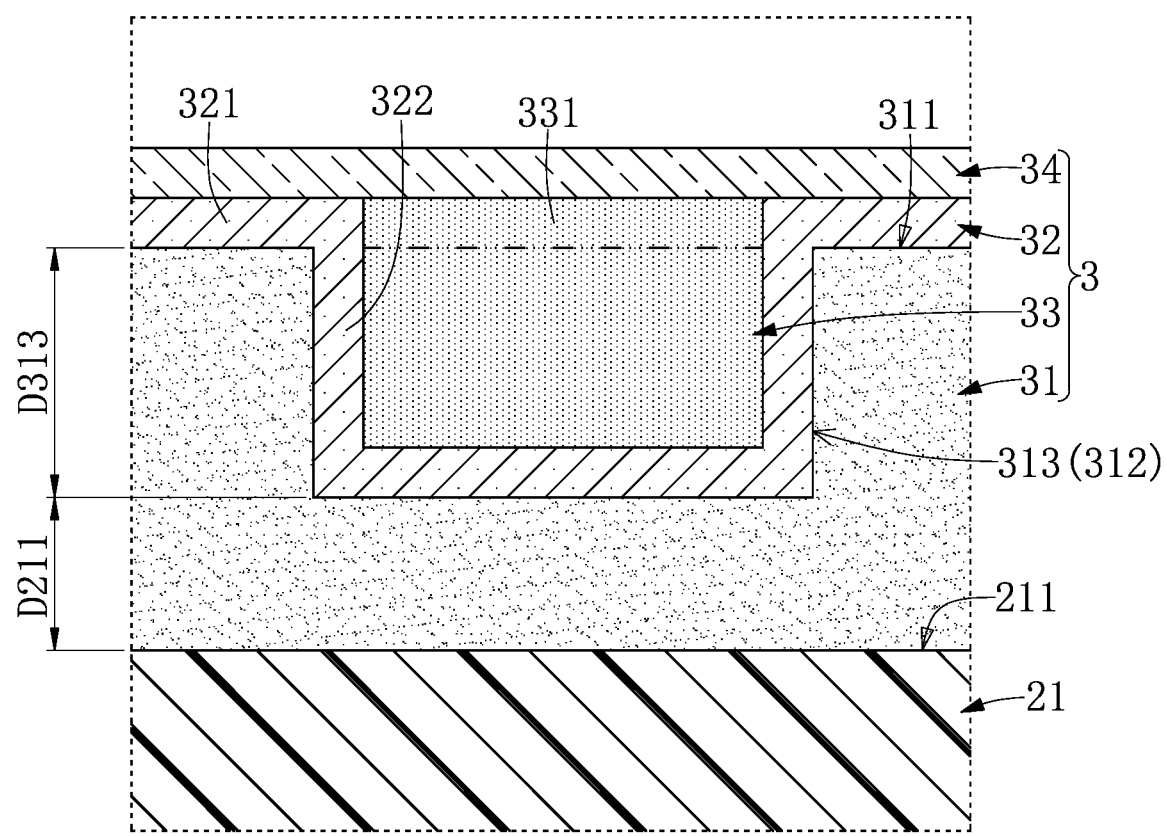
FIG. 6 is an enlarged view of part VI of FIG. 5.

Referring to FIG. 5 and FIG. 6, a second embodiment of the present disclosure which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the chip package structure 100 further includes a transparent protective layer 34 arranged on an outer side thereof (e.g., the transparent protective layer 34 covers the predetermined 2D code pattern having the planar shape), thereby providing a dust-proof effect, a moisture-proof effect, and an anti-corrosion effect to the chip package structure 100 (or the predetermined 2D code pattern) through the transparent protective layer 34.

Third Embodiment

Figure 7:
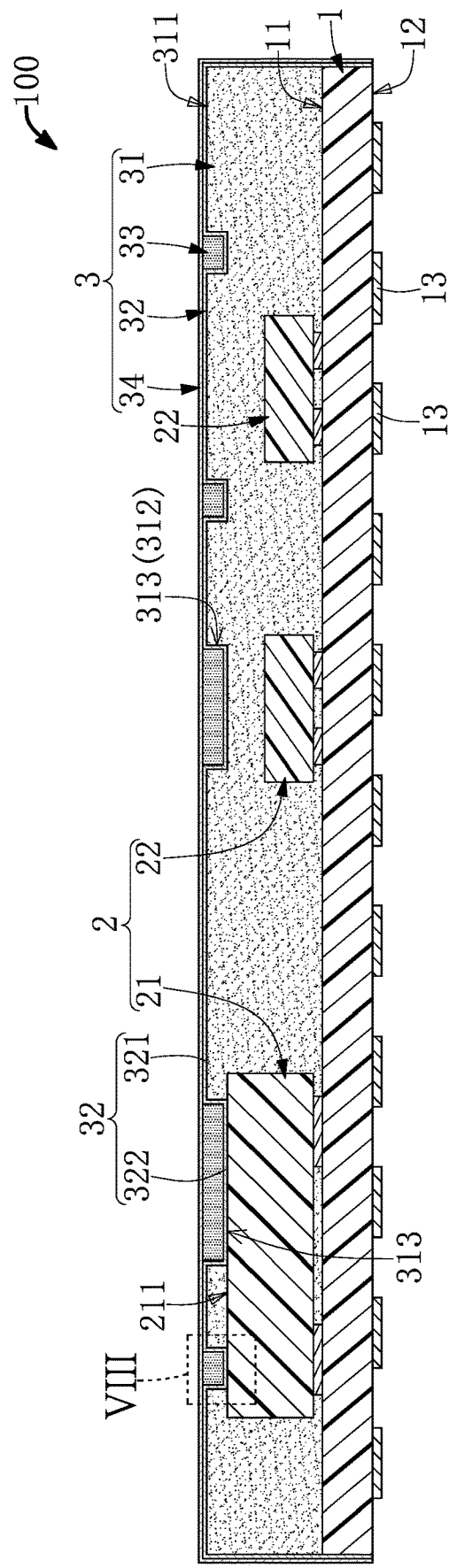
FIG. 7 is a cross-sectional view of the chip package structure according to a third embodiment of the present disclosure.
Figure 8:
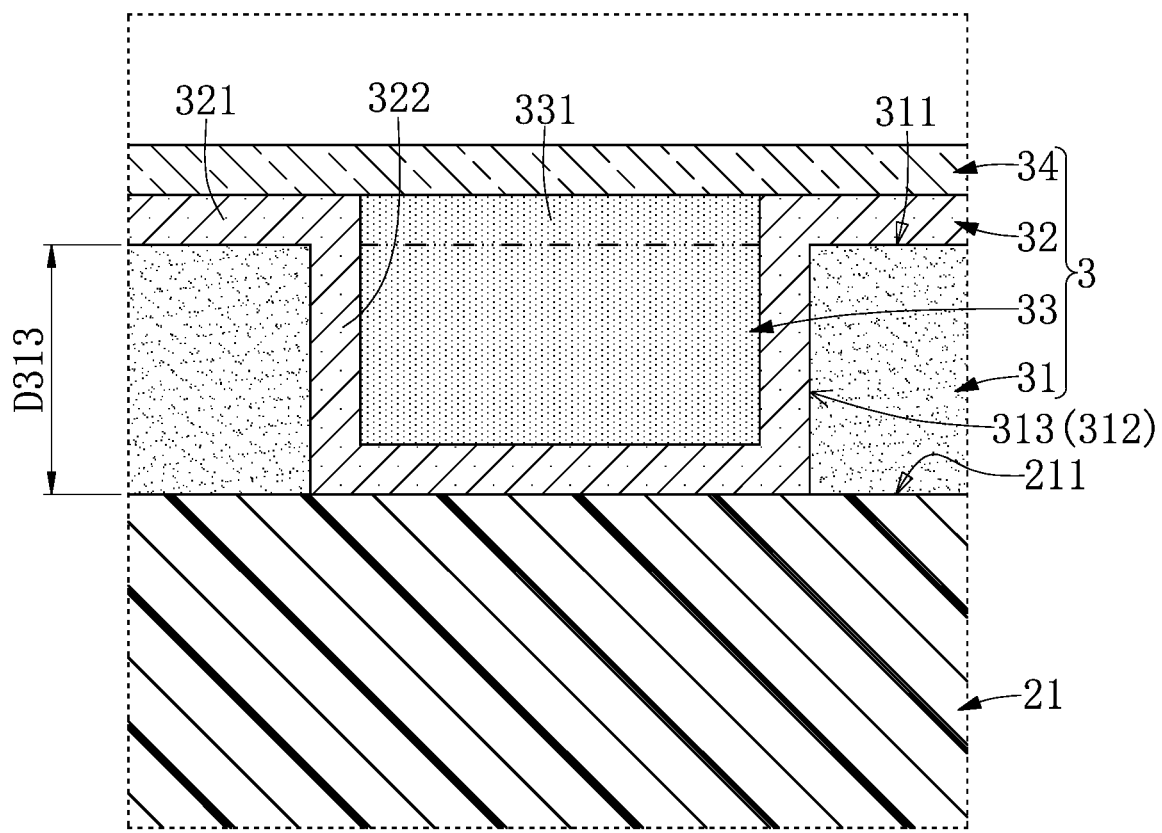
FIG. 8 is an enlarged view of part VIII of FIG. 7.

Referring to FIG. 7 and FIG. 8, a third embodiment of the present disclosure, which is similar to the first and second embodiments of the present disclosure, is provided. For the sake of brevity, descriptions of the same components in the first to third embodiments of the present disclosure will be omitted herein, and the following description only discloses different features among the first to third embodiments.

In the present embodiment, a top side 211 of the at least one chip 21 is exposed from at least one of the slots 313 and is covered by the embedded region 322 of the EMI shielding layer 32. In other words, the top side 211 of the at least one chip 21 forms a bottom of the at least one of the slots 313 adjacent thereto. Moreover, the top side 211 of the at least one chip 21 exposed from the encapsulant 31 is covered by the EMI shielding layer 32, thereby effectively preventing the at least one chip 21 from being affected by EMI.

Fourth Embodiment

Figure 9:
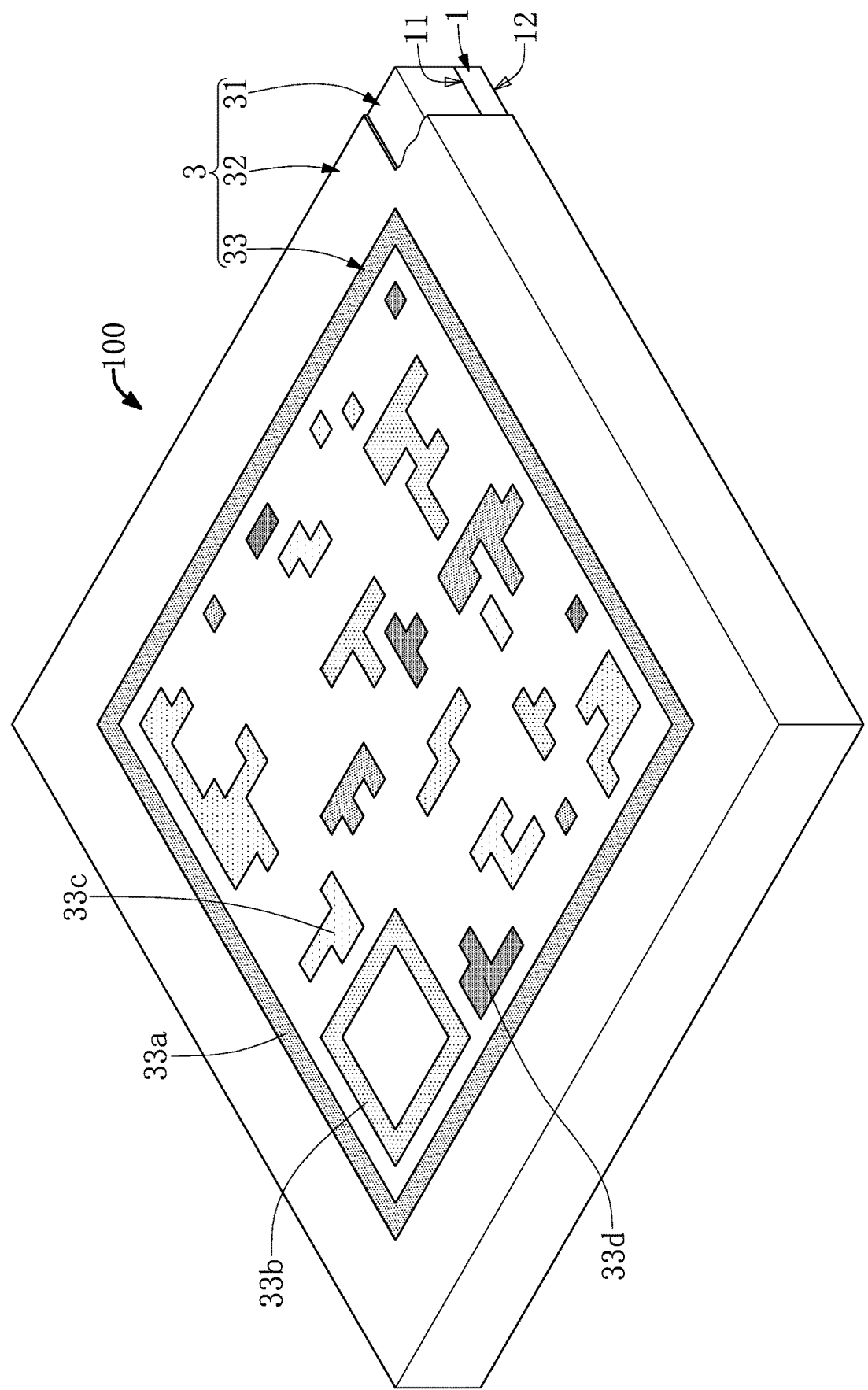
FIG. 9 is a perspective view of the chip package structure according to a fourth embodiment of the present disclosure.

Referring to FIG. 9, a fourth embodiment of the present disclosure, which is similar to the first to third embodiments of the present disclosure, is provided. For the sake of brevity, descriptions of the same components in the first to fourth embodiments of the present disclosure will be omitted herein, and the following description only discloses different features among the first to fourth embodiments.

In the present embodiment, the EMI shielding layer 32 is of a single color (e.g., the EMI shielding layer 32 is a nano-silver layer having a silver color), and the recognition contrast layer 33 has a plurality of regions 33a, 33b, 33c, 33d respectively having different colors according to design requirements (e.g., the regions 33a, 33b, 33c, 33d can be toner layers having different colors). Any one of the different colors of the recognition contrast layer 33 and the color of the encapsulant 31 are provided by conforming to grade A or grade B in the ISO/IEC 15415 standard, thereby allowing the predetermined 2D code pattern to have different appearances.

Beneficial Effects of the Embodiments

In conclusion, any one of the chip package structure and the EMI shielding package module of the present disclosure is provided with the predetermined 2D code pattern that is formed by a structural cooperation of the encapsulant, the EMI shielding layer, and the recognition contrast layer, so that the predetermined 2D code pattern not only provides for high recognition accuracy, but also has a planar shape that is not easily damaged.

Specifically, in the chip package structure provided by the present disclosure, the EMI shielding covers the entirety of the outer surface of the encapsulant (e.g., the EMI shielding layer entirely covers the inner walls of the slots), thereby effectively preventing the at least one chip from being affected by EMI and preventing the at least one chip from being exposed to the external environment through an adjacent one of the slots.

Moreover, in the chip package structure provided by the present disclosure, the recognition contrast layer can include different colors according to design requirements, thereby allowing the predetermined 2D code pattern to have different appearances.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip package structure, comprising:
   a substrate having a first board surface and a second board surface that is opposite to the first board surface, wherein the substrate has a plurality of conductive portions arranged on the second board surface;
   a chip module mounted on the first board surface and electrically coupled to the plurality of conductive portions;
   an encapsulant formed on the first board surface, wherein the chip module is embedded in the encapsulant, and wherein the encapsulant has a patterned trench that is recessed in a top surface thereof and that corresponds in shape to a predetermined two-dimensional (2D) code pattern;
   an electromagnetic interference (EMI) shielding layer covering the encapsulant, wherein the EMI shielding layer includes a recognition region formed on the top surface and an embedded region that is formed in the patterned trench; and
   a recognition contrast layer filled in the patterned trench and connected to the embedded region, wherein the recognition contrast layer and the recognition region of the EMI shielding layer respectively have different colors that conform to grade A or grade B in ISO/IEC 15415 standard;
   wherein an end portion of the recognition contrast layer protrudes from the top surface of the encapsulant and is coplanar with the recognition region of the EMI shielding layer, so that the recognition contrast layer and the recognition region of the EMI shielding layer jointly form the predetermined 2D code pattern having a planar shape.

2. The chip package structure according to claim 1, wherein the patterned trench has a plurality of slots that are separate from each other, and the embedded region has a plurality of portions that are respectively located in the plurality of slots and that are integrally connected to the recognition region so as to be jointly formed as a single one-piece structure.

3. The chip package structure according to claim 2, wherein each of the plurality of slots is a laser engraving slot and has a depth within a range from 15 μm to 30 μm.

4. The chip package structure according to claim 2, wherein the chip module includes at least one chip and a plurality of passive components, and wherein the at least one chip and the plurality of passive components are mounted on the first board surface, and a top side of the at least one chip is exposed from at least one of the slots and is covered by the embedded region of the EMI shielding layer.

5. The chip package structure according to claim 2, wherein the chip module includes at least one chip and a plurality of passive components, and wherein the at least one chip and the plurality of passive components are mounted on the first board surface, and a top side of the at least one chip is embedded in the encapsulant and is spaced apart from at least one of the slots adjacent thereto by a distance within a range from 1 μm to 10 μm.

6. The chip package structure according to claim 1, wherein the EMI shielding layer is a nano-metallic layer and is of a single color, and the recognition contrast layer is a toner layer and has a plurality of regions respectively having different colors.

7. The chip package structure according to claim 1, further comprising a transparent protective layer covering the predetermined 2D code pattern having the planar shape.

8. An electromagnetic interference (EMI) shielding package module of a chip package structure, comprising:
   an encapsulant having a patterned trench that is recessed in a top surface thereof and that corresponds in shape to a predetermined two-dimensional (2D) code pattern;
   an EMI shielding layer covering the encapsulant, wherein the EMI shielding layer includes a recognition region formed on the top surface and an embedded region that is formed in the patterned trench; and
   a recognition contrast layer filled in the patterned trench and connected to the embedded region, wherein the recognition contrast layer and the recognition region of the EMI shielding layer respectively have different colors that conform to grade A or grade B in ISO/IEC 15415 standard;
   wherein an end portion of the recognition contrast layer protrudes from the top surface of the encapsulant and is coplanar with the recognition region of the EMI shielding layer, so that the recognition contrast layer and the recognition region of the EMI shielding layer jointly form the predetermined 2D code pattern having a planar shape.

9. The EMI shielding package module according to claim 8, wherein the patterned trench has a plurality of slots that are separate from each other, and each of the plurality of slots has a depth within a range from 15 μm to 30 μm.

10. The EMI shielding package module according to claim 9, wherein the EMI shielding layer is a nano-metallic layer, the recognition contrast layer is a toner layer, and the EMI shielding package module further comprises a transparent protective layer covering the predetermined 2D code pattern having the planar shape.

* * * * *